(12) United States Patent
Kang et al.

(10) Patent No.: US 11,444,117 B2
(45) Date of Patent: Sep. 13, 2022

(54) LIGHT EMITTING ELEMENT, LIGHT EMITTING ELEMENT MANUFACTURING METHOD, AND DISPLAY DEVICE INCLUDING LIGHT EMITTING ELEMENT

(71) Applicant: SAMSUNG ELECTRONICS CO., LTD., Suwon-si (KR)

(72) Inventors: Jinhee Kang, Suwon-si (KR); Jitsuo Ota, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/257,610

(22) PCT Filed: Jul. 10, 2019

(86) PCT No.: PCT/KR2019/008481
§ 371 (c)(1),
(2) Date: Jan. 4, 2021

(87) PCT Pub. No.: WO2020/013595
PCT Pub. Date: Jan. 16, 2020

(65) Prior Publication Data
US 2021/0280631 A1    Sep. 9, 2021

(30) Foreign Application Priority Data

Jul. 13, 2018   (KR) .................. 10-2018-0081804

(51) Int. Cl.
*H01L 27/15*      (2006.01)
*H01L 25/075*     (2006.01)
(Continued)

(52) U.S. Cl.
CPC .............. *H01L 27/15* (2013.01); *G09G 3/32* (2013.01); *H01L 25/0753* (2013.01);
(Continued)

(58) Field of Classification Search
CPC . H01L 27/15; H01L 25/0753; H01L 27/1214; H01L 33/0075; H01L 33/06;
(Continued)

(56) References Cited

U.S. PATENT DOCUMENTS 8,084,775 B2   12/2011  Hasnain et al.
10,403,612 B2   9/2019  Lo et al.
(Continued)

FOREIGN PATENT DOCUMENTS

CN    107680989 A    2/2018
JP    7-183576 A     7/1995
(Continued)

OTHER PUBLICATIONS

International Search Report (PCT/ISA/210) dated Oct. 18, 2019 by the International Searching Authority in counterpart International Patent Application PCT/KR2019/008481.
(Continued)

*Primary Examiner* — Andrew Sasinowski
(74) *Attorney, Agent, or Firm* — Sughrue Mion, PLLC

(57) ABSTRACT

A light emitting element, a manufacturing method therefor, and a display device including the light emitting element are disclosed. Particularly, disclosed are a multi-tunnel junction light emitting element having two or more light emitting regions, which are horizontally separated from each other, and a manufacturing method therefor, and disclosed is a display device which includes the light emitting element so as to efficiently arrange pixels and independently control the light emitting regions.

15 Claims, 15 Drawing Sheets

(51) Int. Cl.
    *H01L 27/12*     (2006.01)
    *H01L 33/00*     (2010.01)
    *H01L 33/32*     (2010.01)
    *H01L 33/38*     (2010.01)
    *H01L 33/46*     (2010.01)
    *H01L 33/06*     (2010.01)
    *H01L 33/62*     (2010.01)
    *G09G 3/32*     (2016.01)

(52) U.S. Cl.
    CPC ...... *H01L 27/1214* (2013.01); *H01L 33/0075* (2013.01); *H01L 33/06* (2013.01); *H01L 33/32* (2013.01); *H01L 33/382* (2013.01); *H01L 33/46* (2013.01); *H01L 33/62* (2013.01); *G09G 2320/0242* (2013.01); *G09G 2330/023* (2013.01); *G09G 2330/10* (2013.01); *H01L 2933/0016* (2013.01); *H01L 2933/0025* (2013.01)

(58) Field of Classification Search
    CPC ....... H01L 33/32; H01L 33/382; H01L 33/46; H01L 33/62; H01L 2933/0016; H01L 2933/0025; H01L 33/04; H01L 33/08; H01L 33/405; H01L 27/153; H01L 25/167; H01L 33/44; H01L 27/156; H01L 33/24; G09G 3/32; G09G 2320/0242; G09G 2330/023; G09G 2330/10
    See application file for complete search history.

(56) References Cited

U.S. PATENT DOCUMENTS

| | | |
|---|---|---|
| 2009/0078955 A1 | 3/2009 | Fan et al. |
| 2011/0204376 A1 | 8/2011 | Su et al. |
| 2012/0058584 A1 | 3/2012 | Hasnain et al. |
| 2017/0213868 A1 | 7/2017 | Damilano et al. |
| 2018/0175268 A1* | 6/2018 | Moon ................ H01L 25/0753 |

FOREIGN PATENT DOCUMENTS

| | | |
|---|---|---|
| KR | 10-1733225 B1 | 5/2017 |
| KR | 10-2017-0122008 A | 11/2017 |
| KR | 10-2017-0133701 A | 12/2017 |
| KR | 10-2018-0071743 A | 6/2018 |

OTHER PUBLICATIONS

Written Opinion (PCT/ISA/237) dated Oct. 18, 2019 by the International Searching Authority in counterpart International Patent Application PCT/KR2019/008481.

* cited by examiner

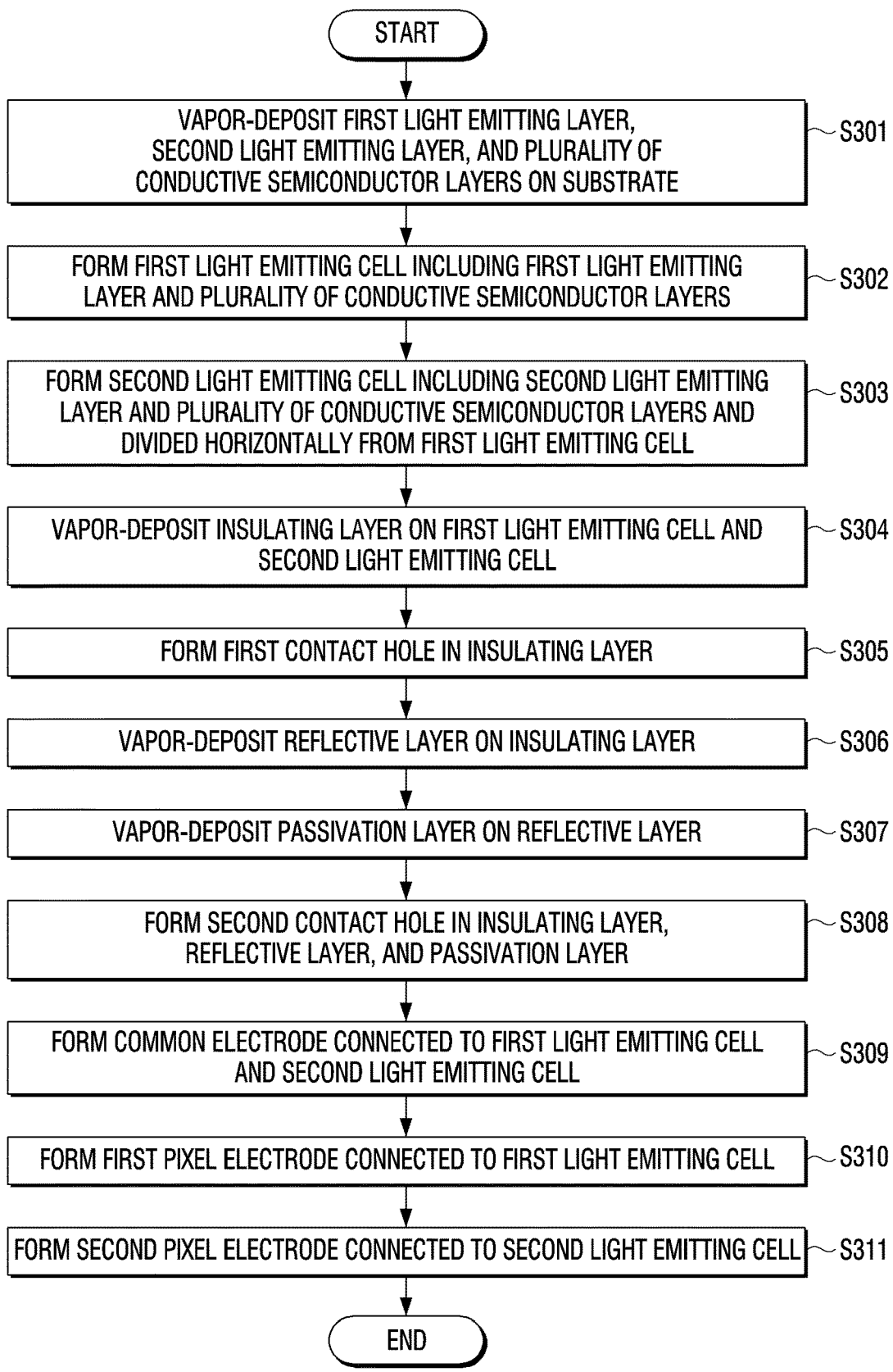

LIGHT EMITTING ELEMENT, LIGHT EMITTING ELEMENT MANUFACTURING METHOD, AND DISPLAY DEVICE INCLUDING LIGHT EMITTING ELEMENT

TECHNICAL FIELD

The disclosure relates to a multi-tunnel junction light emitting element having two or more light emitting regions, which are horizontally separated from each other, and a manufacturing method therefor, and a display device which includes the light emitting element so as to efficiently arrange pixels and independently control the light emitting regions.

BACKGROUND ART

Recently, in the light emitting diode (LED) field, an LED having a multi-tunnel junction structure has been developed for the purpose such as an increase in internal quantum efficiency (IQE) in an LED element, minimization of optical loss, and the like.

However, in a case of the structure of a multi-tunnel junction LED of the related art, reduction of a light emitting region in a single element according to a forming step of an electrode, an increase in power consumption caused by a difference in light emitting efficiency for each color, a complicated step for manufacturing a display device due to a limitation in implementing multi-color of a single element, an increase in defective rate and cost of a repairing step due to the complicated manufacturing step, and the like are pointed out as limitations.

Accordingly, there is a need for a light emitting element that overcomes the limitation of the structure of the related art to be suitable for manufacturing a display device having characteristics of low power, high integration, and high resolution.

DISCLOSURE

Technical Problem

The disclosure is made to solve the problems described above and an object thereof is to provide a multi-tunnel junction light emitting element having two or more light emitting regions, which are horizontally separated from each other, and a manufacturing method therefor, and a display device which includes the light emitting element so as to efficiently arrange pixels and independently control the light emitting regions.

Technical Solution

In accordance with an aspect of the disclosure to achieve the above object, there is provided a light emitting element including a light emitting cell including a first light emitting layer and a plurality of conductive semiconductor layers laminated on upper and lower portions of the first light emitting layer, a second light emitting cell including a second light emitting layer configured to emit light different from the first light emitting layer, and a plurality of conductive semiconductor layers laminated on upper and lower portions of the second light emitting layer, an insulating layer provided on the first light emitting cell and the second light emitting cell so that the first light emitting cell and the second light emitting cell are electrically separated from each other, a common electrode configured to be electrically connected to the first light emitting cell and the second light emitting cell, a first pixel electrode configured to be electrically connected to the first light emitting cell, and a second pixel electrode configured to be electrically connected to the second light emitting cell, in which a light emitting region of the first light emitting cell and a light emitting region of the second light emitting cell are horizontally separated from each other by the common electrode.

The plurality of conductive semiconductor layers may include a first n-GaN layer laminated on a lower portion of the first light emitting layer, a first p-GaN layer laminated on an upper portion of the first light emitting layer, a $p^+$-GaN layer and a $n^+$-GaN layer sequentially laminated on an upper portion of the first p-GaN layer, a second n-GaN layer laminated on a lower portion of the second light emitting layer, and a second p-GaN layer laminated on an upper portion of the second light emitting layer.

The light emitting element may further include a reflective layer provided on the insulating layer, a passivation layer provided on the reflective layer, a first contact hole formed in the insulating layer, and a second contact hole formed in the insulating layer, the reflective layer, and the passivation layer, the first pixel electrode and the second pixel electrode may be electrically connected to the plurality of conductive semiconductor layers via the reflective layer and the first contact hole, and the common electrode may be electrically connected to the plurality of conductive semiconductor layers via the second contact hole.

A light emitting area of the first light emitting cell may be different from a light emitting area of the second light emitting cell.

The first light emitting layer and the second light emitting layer may have a multi-quantum well structure.

The light emitting element may further include a third light emitting cell including a third light emitting layer and a plurality of conductive semiconductor layers laminated on upper and lower portions of the third light emitting layer, and a third pixel electrode configured to be electrically connected to the third light emitting cell, light emitted by the third light emitting layer may be different from at least one of light emitted by the first light emitting layer and light emitted by the second light emitting layer, the common electrode may be configured to be electrically connected to the first light emitting cell, the second light emitting cell, and the third light emitting cell, and the light emitting region of the first light emitting cell, the light emitting region of the second light emitting cell, and a light emitting region of the third light emitting cell may be horizontally separated from each other by the common electrode.

In accordance with another aspect of the disclosure, there is provided a display device including a display panel including a light emitting element and a switching element, and a processor configured to control the display panel.

The light emitting element may include a first light emitting cell including a first light emitting layer and a plurality of conductive semiconductor layers laminated on upper and lower portions of the first light emitting layer, a second light emitting cell including a second light emitting layer configured to emit light different from the first light emitting layer, and a plurality of conductive semiconductor layers laminated on upper and lower portions of the second light emitting layer, an insulating layer provided on the first light emitting cell and the second light emitting cell so that the first light emitting cell and the second light emitting cell are electrically separated from each other, a common electrode configured to be electrically connected to the first light emitting cell and the second light emitting cell, a first pixel electrode configured to be electrically connected to the first light emitting cell, and a second pixel electrode configured to be electrically connected to the second light emitting cell, and a light emitting region of the first light emitting cell and a light emitting region of the second light emitting cell may be horizontally separated from each other by the common electrode.

The display panel may include a first switching element electrically connected to the first pixel electrode and a second switching element electrically connected to the second pixel electrode, and the processor may be configured to independently control driving of the first light emitting cell and the second light emitting cell via the first switching element and the second switching element.

The processor may be configured to, based on a defective pixel being generated in at least one of the first light emitting cell and the second light emitting cell, control the driving of at least one of a first light emitting cell and a second light emitting cell included in a light emitting element adjacent to a light emitting element where the defective pixel is generated, to replace the defective pixel.

A light emitting area of the first light emitting cell may be different from a light emitting area of the second light emitting cell.

In accordance with still another aspect of the disclosure, there is provided a method for manufacturing a light emitting element, the method including vapor-depositing a first light emitting layer, a second light emitting layer configured to emit light different from the first light emitting layer, and a plurality of conductive semiconductor layers laminated on upper and lower portions of the first light emitting layer on a substrate, forming a first light emitting cell including the first light emitting layer and the plurality of conductive semiconductor layers, forming a second light emitting cell including the second light emitting layer and the plurality of conductive semiconductor layers and horizontally separated from the first light emitting cell, vapor-depositing an insulating layer on the first light emitting cell and the second light emitting cell so that the first light emitting cell is electrically separated from the second light emitting cell, forming a common electrode electrically connected to the first light emitting cell and the second light emitting cell in a region separated between the first light emitting cell and the second light emitting cell, forming a first pixel electrode electrically connected to the first light emitting cell, and forming a second pixel electrode electrically connected to the second light emitting cell.

The vapor-depositing the first light emitting layer, the second light emitting layer, and the plurality of conductive semiconductor layers may further include vapor-depositing a first n-GaN layer on the substrate, vapor-depositing the first light emitting layer on an upper portion of the first n-GaN layer, sequentially vapor-depositing a first p-GaN layer, a p$^+$-GaN layer, and a n$^+$-GaN layer on an upper portion of the first light emitting layer, vapor-depositing a second n-GaN layer on an upper portion of the n$^+$-GaN layer, vapor-depositing the second light emitting layer on an upper portion of the second n-GaN layer, and vapor-depositing a second p-GaN layer on an upper portion of the second light emitting layer.

The method for manufacturing the light emitting element may further include forming a first contact hole in the insulating layer, vapor-depositing a reflective layer on the insulating layer, vapor-depositing a passivation layer on the reflective layer, and forming a second contact hole in the insulating layer, the reflective layer, and the passivation layer, the forming the first contact hole may include forming the first contact hole so that the first pixel electrode and the second pixel electrode are electrically connected to the plurality of conductive semiconductor layers via the reflective layer, and the forming the second contact hole may include forming the second contact hole so that the common electrode is electrically connected to the plurality of conductive semiconductor layers.

The forming the second light emitting cell may include forming the second light emitting cell so that a light emitting area of the second light emitting cell is different from a light emitting area of the first light emitting cell.

DESCRIPTION OF DRAWINGS

FIG. 3 is a flowchart illustrating the method for manufacturing the light emitting element according to FIGS. 2A to 2F;

DETAILED DESCRIPTION OF EXEMPLARY EMBODIMENTS

Figure 1:
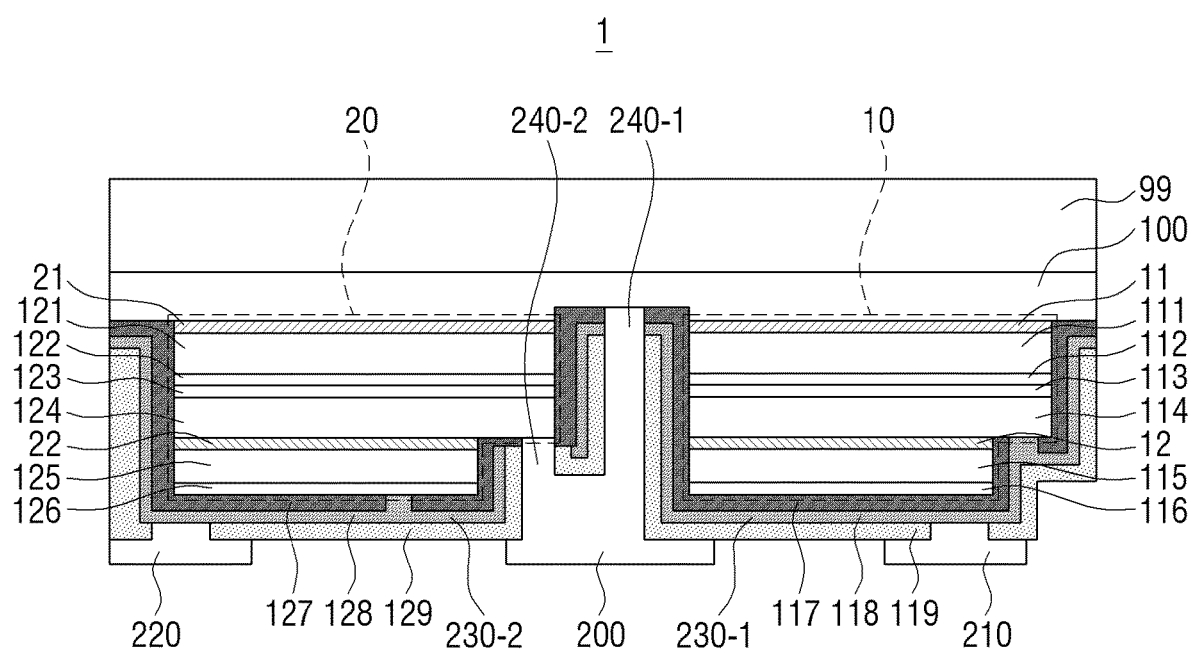
FIG. 1 is a cross-sectional view illustrating a structure of a light emitting element according to an embodiment.

The embodiments may be variously changed and include various embodiments, and specific embodiments will be shown in the drawings and described in detail in the description. However, it should be understood that this is not to limit the scope of the specific embodiments and all modifications, equivalents, and/or alternatives included in the disclosed spirit and technical scope are included. In relation to explanation of the drawings, similar reference numerals may be used for similar elements.

In describing the disclosure, a detailed description of the related art or configuration may be omitted when it is determined that the detailed description may unnecessarily obscure a gist of the disclosure.

In addition, the embodiments below may be changed in various forms and the scope of the technical idea of the disclosure is not limited to the embodiments below. The embodiments are provided to complete the disclosure and completely transfer the technical idea of the disclosure to those skilled in the art.

The terms used in the disclosure are used to describe a specific embodiment, and may not intend to limit the scope of claims. In the disclosure, unless otherwise defined specifically, a singular expression may encompass a plural expression.

In this disclosure, the terms such as "comprise", "may comprise", "consist of", or "may consist of" are used herein to designate a presence of corresponding features (e.g., constituent elements such as number, function, operation, or part), and not to preclude a presence of additional features.

In this disclosure, expressions such as "A or B", "at least one of A [and/or] B,", or "one or more of A [and/or] B,"

include all possible combinations of the listed items. For example, "A or B", "at least one of A and B,", or "at least one of A or B" includes any of (1) at least one A, (2) at least one B, or (3) at least one A and at least one B.

The expressions "first," "second" and the like used in the disclosure may denote various elements, regardless of order and/or importance, and may be used to distinguish one element from another, and does not limit the elements.

If it is described that a certain element (e.g., first element) is "operatively or communicatively coupled with/to" or is "connected to" another element (e.g., second element), it should be understood that the certain element may be connected to the other element directly or through still another element (e.g., third element). On the other hand, if it is described that a certain element (e.g., first element) is "directly coupled to" or "directly connected to" another element (e.g., second element), it may be understood that there is no element (e.g., third element) between the certain element and the another element.

Also, the expression "configured to" used in the disclosure may be interchangeably used with other expressions such as "suitable for," "having the capacity to," "designed to," "adapted to," "made to," and "capable of," depending on cases. Meanwhile, the expression "configured to" does not necessarily refer to a device being "specifically designed to" in terms of hardware.

Instead, under some circumstances, the expression "a device configured to" may refer to the device being "capable of" performing an operation together with another device or component. For example, the phrase "a unit or a processor configured (or set) to perform A, B, and C" may refer, for example, and without limitation, to a dedicated processor (e.g., an embedded processor) for performing the corresponding operations, a generic-purpose processor (e.g., a central processing unit (CPU) or an application processor), or the like, that can perform the corresponding operations by executing one or more software programs stored in a memory device.

Hereinafter, the disclosure will be described in detail with reference to the accompanying drawings.

Hereinafter, the embodiment of the disclosure will be described in detail with reference to the accompanying drawings so that those skilled in the art easily carry out the embodiment. The disclosure may be implemented in various different forms and is not limited to the embodiment described herein.

In addition, a part not related to the description is omitted in the drawings, in order to clearly describe the invention, and the same reference numerals are used for the same parts throughout the entire specification.

FIG. 1 is a cross-sectional view illustrating a structure of a light emitting element according to an embodiment.

Referring to FIG. 1, a light emitting element 1 according to an embodiment of the disclosure may include a first light emitting cell 10, a second light emitting cell 20, insulating layers 117 and 127, a common electrode 200, a first pixel electrode 210, and a second pixel electrode 220.

The first light emitting cell 10 may include first light emitting layers 11 and 12, and a plurality of conductive semiconductor layers laminated on upper and lower portions of the first light emitting layers 11 and 21, and the second light emitting cell 20 may include second light emitting layers 21 and 22 and a plurality of conductive semiconductor layers laminated on upper and lower portions of the second light emitting layers 21 and 22.

Hereinafter, the first light emitting cell 10 and the second light emitting cell 20 may be collectively referred to as a light emitting cell, if there is no need to distinguish these. The first light emitting layers 11 and 21, the second light emitting layers 12 and 22, the first pixel electrode 210, the second pixel electrode 220, and the like which will be described below may also be collectively referred to as a light emitting layer, a pixel electrode, and the like, respectively.

First, the plurality of conductive semiconductor layers may be implemented as III-V compound semiconductors, II-VI compound semiconductors, and the like. In particular, the plurality of conductive semiconductor layers may be implemented as nitride semiconductor layers, particularly, GaN semiconductor layers. However, the plurality of conductive semiconductor layers according to the disclosure are not limited thereto and may be formed of various materials according to various properties required for the light emitting element 1.

The plurality of conductive semiconductor layers may include an n-type semiconductor, a p-type semiconductor, a $p^+$-type semiconductor, an $n^+$-type semiconductor, and the like.

Herein, the n-type semiconductor may refer to a semiconductor using a free electron as a charge carrier and may be formed by doping an n-type dopant such as Si, Ge, Sn, Te, or the like. The p-type semiconductor may refer to a semiconductor using an electron hole as a charge carrier and may be formed by doping a p-type dopant such as Mg, Zn, Ca, Ba, or the like.

Meanwhile, as will be described below, the light emitting layer may be emitted since the light emitting layer is laminated between the n-type semiconductor and the p-type semiconductor.

Meanwhile, the $p^+$-type semiconductor and the $n^+$-type semiconductor may be formed by overdoping the dopant described above so as to reduce electric resistance and improve a current distribution to enable uniform light emission over the entire chip.

The $p^+$-type semiconductor and the $n^+$-type semiconductor may be sequentially laminated on the upper portion of the p-type semiconductor, and accordingly, the n-type semiconductor, the second light emitting layers 12 and 22, and the p-type semiconductor may be sequentially laminated on the upper portion of the $n^+$-type semiconductor, thereby forming a multi-tunnel junction structure.

Meanwhile, hereinafter, the laminated structure of the plurality of conductive semiconductors according to an embodiment of the disclosure will be described with reference to a case of the GaN semiconductor layer. Meanwhile, unlike the direction illustrated in FIG. 1, the description hereinafter will be made by specifying a substrate 99 as a lowermost element. This is for a method for manufacturing the light emitting element 1 which will be described later.

Specifically, according to an embodiment of the disclosure, the plurality of conductive semiconductor layers formed of GaN layers may include a first n-GaN layer 100 laminated on the substrate 99, the first light emitting layers 11 and 21 laminated on an upper portion of the first n-GaN layer 100, first p-GaN layers 111 and 121 laminated on an upper portion of the first light emitting layers 11 and 21, $p^+$-GaN layers 112 and 122 and $n^+$-GaN layers 113 and 123 sequentially laminated on an upper portion of the first p-GaN layers 111 and 121, second n-GaN layers 114 and 124 laminated on a lower portion of the second light emitting layers 12 and 22, and second p-GaN layers 115 and 125 laminated on an upper portion of the second light emitting layers 12 and 22.

In addition, as illustrated in FIG. 1, p$^+$-GaN layers 116 and 126 may be further included on the upper portion of the second p-GaN layers 115 and 125. In addition, various conductive semiconductor layers may be further included within a range for achieving the object of the disclosure.

Meanwhile, the light emitting layer may be positioned between the n-type semiconductor and the p-type semiconductor and may be a layer where the electron as the carrier of the n-type semiconductor and the electron hole as the carrier of the p-type semiconductor meet each other. When the electron and the electron hole meet each other in the light emitting layer, a potential barrier may be formed according to recombination of the electron and the electron hole. When the electron and the electron hole transition to a low energy level over the potential barrier according to an applied voltage, light at a wavelength corresponding thereto may be generated.

Herein, the light emitting layer may have a multi-quantum well (MQW) structure, but is not limited thereto, and may have various structures such as a quantum dot structure and the like.

Meanwhile, when the light emitting layer is formed of the multi-quantum well structure, a well layer/a barrier layer of the light emitting layer may be formed with a structure such as InGaN/GaN, InGaN/InGaN, or GaAs(InGaGs)/AlGaAs, but is not limited to such a structure.

Meanwhile, according to an embodiment of the disclosure, the first light emitting layers 11 and 21 and the second light emitting layers 12 and 22 are laminated in sequence in a vertical relationship, respectively. However, as will be described later, the first light emitting cell 10 and the second light emitting cell 20 may be horizontally separated from each other by the common electrode 200, and accordingly, the first light emitting layers 11 and 21 and the second light emitting layers 12 and 22 may be separated into the light emitting layers 11 and 12 included in the first light emitting cell 10 and the light emitting layers 21 and 22 included in the second light emitting cell 20.

In other words, the first light emitting cell 10 may include the first light emitting layer 11, the second light emitting layer 12, and the plurality of conductive semiconductor layers laminated on the upper and lower portions thereof, and the second light emitting cell 20 may include the first light emitting layer 12, the second light emitting layer 22, and the plurality of conductive semiconductor layers laminated on the upper and lower portions thereof.

In addition, as will be described later, the first light emitting layer 11 included in the first light emitting cell 10 may be electrically connected to the common electrode 200 and the first pixel electrode 210 to emit light, but the first light emitting layer 21 included in the second light emitting cell 20 may not emit light.

In the same manner, as will be described later, the second light emitting layer 22 included in the second light emitting cell 20 may be electrically connected to the common electrode 200 and the second pixel electrode 220 to emit light, but the second light emitting layer 12 included in the first light emitting cell 10 may not emit light.

Accordingly, hereinafter, for convenience, only the layer included in the first light emitting cell 10 and emitting light among the first light emitting layers 11 and 21 may be referred to as the first light emitting layer 11, and only the layer included in the second light emitting cell 20 and emitting light among the second light emitting layers 12 and 22 may be referred to as the second light emitting layer 22.

Meanwhile, a material and a thickness of the light emitting layer may be variously selected, thereby emitting light at different wavelengths. In particular, different light may be emitted by differently selecting the materials included in the first light emitting layers 11 and 21 and the second light emitting layers 12 and 22.

Meanwhile, the light emitting element 1 according to an embodiment of the disclosure may further include the insulating layers 117 and 127.

Specifically, the insulating layers 117 and 127 may be provided on the first light emitting cell 10 and the second light emitting cell 20 so that the first light emitting cell 10 and the second light emitting cell 20 are electrically separated from each other. A silicon dioxide (SiO$_2$) may be mainly used for such insulating layers 117 and 127, but the material of the insulating layers 117 and 127 according to the disclosure is not limited to the specific material.

Meanwhile, the light emitting element 1 according to an embodiment of the disclosure may further include reflective layers 118 and 128. The reflective layers 118 and 128 may play a role of increasing light emitting efficiency of the light emitting cells and may also play a role of electrically connecting the first pixel electrode 210 and the second pixel electrode 220 to the plurality of conductive semiconductor layers.

Various metal materials having a high reflectance and high electrical conductivity as aluminum (Al) may be used for such reflective layers 118 and 128, but the material of the reflective layers 118 and 128 according to the disclosure is not limited to the specific material.

Meanwhile, the light emitting element 1 according to an embodiment of the disclosure may further include passivation layers 119 and 129.

The passivation layers 119 and 129 may be positioned between the reflective layers 118 and 128 and the common electrode 200 and between the reflective layers 118 and 128 and the pixel electrodes 210 and 220, thereby stabilizing the properties of the light emitting element 1. A silicon dioxide (SiO$_2$) may be used for such passivation layers 119 and 129, but the material of the passivation layers 119 and 129 according to the disclosure is not limited to the specific material.

Meanwhile, first contact holes 230-1 and 230-2 may be formed in the insulating layers 117 and 127 described above, and second contact holes 240-1 and 240-2 may be formed in the insulating layers 117 and 127, the reflective layers 118 and 128, and the passivation layers 119 and 129. As will be described later, such contact holes may play a role of a path for electrically connecting the common electrode 200 and the pixel electrodes 210 and 220 to the first light emitting cell and the second light emitting cell.

Meanwhile, referring to FIG. 1, the light emitting element 1 according to the disclosure may be implemented in a flip-chip structure by disposing the common electrode 200, the first pixel electrode 210, and the second pixel electrode 220 connected to the first light emitting cell 10 and the second light emitting cell 20.

The common electrode 200 may be electrically connected to the first light emitting cell 10 and the second light emitting cell 20. Specifically, the common electrode 200 may be connected to the plurality of conductive semiconductor layers included in the first light emitting cell 10 and the second light emitting cell 20 via the second contact holes 240-1 and 240-2.

The common electrode 200 may be formed between the first light emitting cell 10 and the second light emitting cell 20 to horizontally separate the first light emitting cell 10 and the second light emitting cell 20 from each other. Accordingly, a light emitting region of the first light emitting cell 10 and a light emitting region of the second light emitting cell 20 may also be horizontally separated from each other.

Meanwhile, the first pixel electrode 210 may be electrically connected to the first light emitting cell 10 and the second pixel electrode 220 may be electrically connected to the second light emitting cell 20. In other words, the first pixel electrode 210 may only be electrically connected to the first light emitting cell 10 and may not be electrically connected to the second light emitting cell 20, and the second pixel electrode 220 may only be electrically connected to the second light emitting cell 20 and may not be electrically connected to the first light emitting cell 10.

Specifically, the first pixel electrode 210 and the second pixel electrode 220 may be connected to the plurality of conductive semiconductor layers included in the first light emitting cell 10 and the second light emitting cell 20 via the first contact holes 230-1 and 230-2 and the reflective layers 118 and 128, respectively.

As described above, since the first pixel electrode 210 and the second pixel electrode 220 are individually connected to the first light emitting cell 10 and the second light emitting cell 20, a processor of a display device may independently control driving of the first light emitting cell 10 and the second light emitting cell 20, as will be described later.

Meanwhile, hereinabove, the light emitting element 1 including the first light emitting cell 10 and the second light emitting cell 20 has been described, but the disclosure is not limited thereto, and the light emitting element 1 may further include a plurality of light emitting cells such as a third light emitting cell (not illustrated) and the like.

In other words, the light emitting element 1 according to an embodiment of the disclosure may further include the third light emitting cell including a third light emitting layer and a plurality of conductive semiconductor layers laminated on upper and lower portions of the third light emitting layer, and a third pixel electrode (not illustrated) electrically connected to the third light emitting cell.

The light emitted by the third light emitting layer may be different from at least one of the light emitted by the first light emitting layers 11 and 21 and the light emitted by the second light emitting layers 12 and 22, the common electrode 200 may be electrically connected to the first light emitting cell 10, the second light emitting cell 20, and the third light emitting cell, and the light emitting region of the first light emitting cell 10, the light emitting region of the second light emitting cell 20, and a light emitting region of the third light emitting cell may be horizontally separated from each other by the common electrode 200.

Meanwhile, as described above, the light emitting region in the light emitting element 1 according to an embodiment of the disclosure may be horizontally separated according to the light emitting region of the first light emitting cell 10 and the light emitting region of the second light emitting cell 20. In other words, according to various embodiments of the disclosure, a multi-tunnel junction light emitting element having two or more light emitting regions horizontally separated from each other may be provided.

According to the light emitting element 1 described above, it is possible to reduce production cost of a display device, since pixels with two or more colors may be implemented in a single light emitting element.

In addition, according to the structure of the light emitting element 1 described above, the number of metal wirings necessary to manufacture the display device may be reduced compared to a light emitting element of the related art, thereby easily designing the display device.

Further, the plurality of light emitting regions included in the light emitting element 1 may be independently controlled, and accordingly, the light emitting regions may be efficiently defined during the manufacturing process of the display device.

Such a display device will be described later with reference to FIGS. 4 to 7.

Meanwhile, before describing the display device according to the disclosure, a method for manufacturing the light emitting element 1 described above will be described hereinafter with reference to FIGS. 2A to 2F and FIG. 3.

FIGS. 2A to 2F are cross-sectional views illustrating a method for manufacturing the light emitting element in sequence according to an embodiment, and FIG. 3 is a flowchart illustrating the method for manufacturing the light emitting element according to FIGS. 2A to 2F.

Hereinafter, the description will be made with reference to FIGS. 2 and 3. Meanwhile, the reference numerals of FIG. 2 are used differently from those of FIG. 1, in order to efficiently describe the laminated structure sequentially formed according to the method for manufacturing the light emitting element.

Meanwhile, the structure of the light emitting element according to an embodiment of the disclosure and properties of each layer included in the light emitting element have been described in the above with reference to FIG. 1, and therefore the overlapped description will not be repeated.

A substrate 1 used in the method for manufacturing the light emitting element according to an embodiment of the disclosure may be a material suitable for semiconductor material growth or a carrier wafer. Specifically, the substrate 1 may be formed of a material such as sapphire ($Al_2SO_4$), SiC, GaN, GaAs, ZnO, and the like, but the material of the substrate used in the disclosure is not limited to the specific material.

Figure 2A:
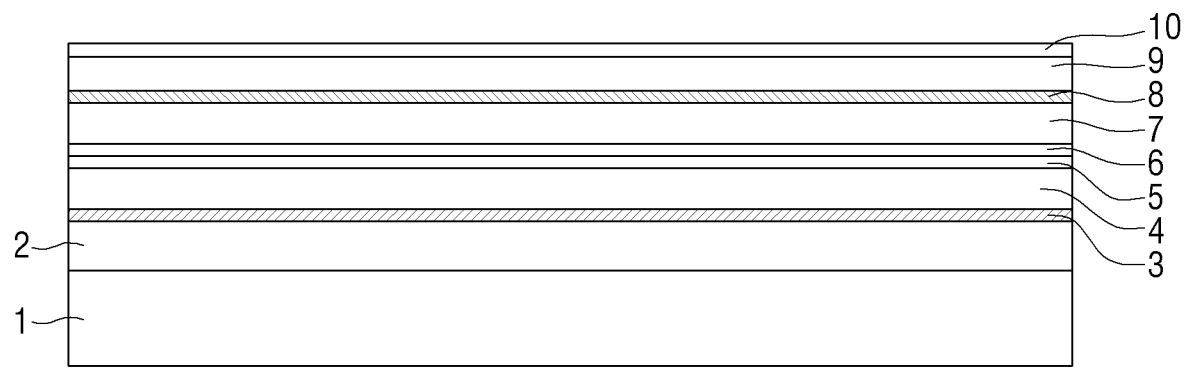
FIGS. 2A to 2F are cross-sectional views illustrating a method for manufacturing the light emitting element in sequence according to an embodiment.

When the substrate 1 is provided, as illustrated in FIG. 2A, a first light emitting layer 3, a second light emitting layer 8 emitting light different from that of the first light emitting layer 3, and a plurality of conductive semiconductor layers 2, 4, 5, 6, 7, 9, and 10 laminated on upper and lower portions of the first light emitting layer 3 may be vapor-deposited on the substrate 1 (S301).

Such vapor deposition may be performed by using process technology such as metal organic chemical vapor deposition (MOCVD) or molecular beam epitaxy (MBE).

Specifically, a step of vapor-depositing the light emitting layers 3 and 8 and the plurality of conductive semiconductor layers 2, 4, 5, 6, 7, 9, and 10 on the substrate 1 may be performed in the following order.

First, a first n-GaN layer 2 may be vapor-deposited on the substrate 1, a first light emitting layer 3 may be vapor-deposited on an upper portion of the first n-GaN layer 2, a first p-GaN layer 4, a $p^+$-GaN layer 5, and an $n^+$-GaN layer 6 may be sequentially vapor-deposited on an upper portion of the first light emitting layer 3, a second n-GaN layer 7 may be vapor-deposited on an upper portion of the $n^+$-GaN layer 6, the second light emitting layer 8 may be vapor-deposited on the second n-GaN layer 7, and a second p-GaN layer 9 may be vapor-deposited on the second light emitting layer 8.

In addition, a $p^+$-GaN layer 10 may be additionally vapor-deposited on the second p-GaN layer 9. Various conductive semiconductor layers may be further vapor-deposited within a range for achieving the object of the disclosure.

Figure 2B:
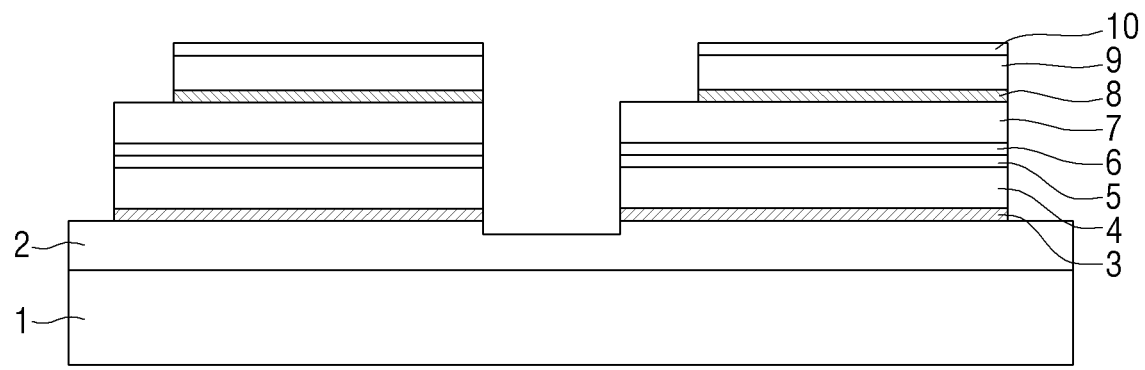

When the light emitting layers and the plurality of conductive semiconductor layers are vapor-deposited, as illustrated in FIG. 2B, a first light emitting cell including the first light emitting layer 3 and the plurality of conductive semiconductor layers may be formed (S302), and a second light emitting cell including the second light emitting layer 8 and the plurality of conductive semiconductor layers and horizontally separated from the first light emitting cell may be formed (S303).

The specific configuration of the first light emitting cell and the second light emitting cell has been described above with reference to FIG. 1, and therefore the overlapped description will not be repeated.

Meanwhile, the light emitting cell may be formed through photolithography and etching.

Specifically, the light emitting layers 3 and 8 and the plurality of conductive semiconductor layers 2, 4, 5, 6, 7, 9, and 10 laminated may be etched so that the first light emitting cell and the second light emitting cell are horizontally separated from each other.

Figure 2C:
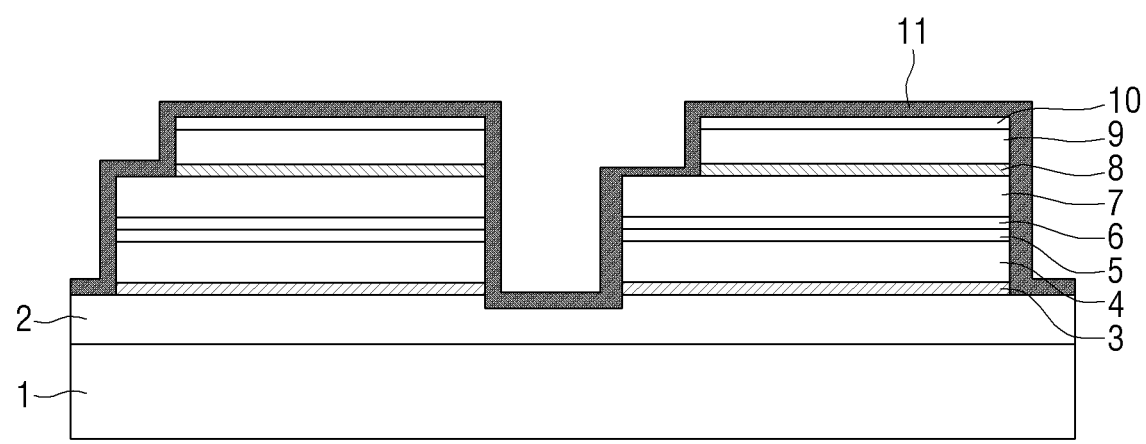
Figure 2D:
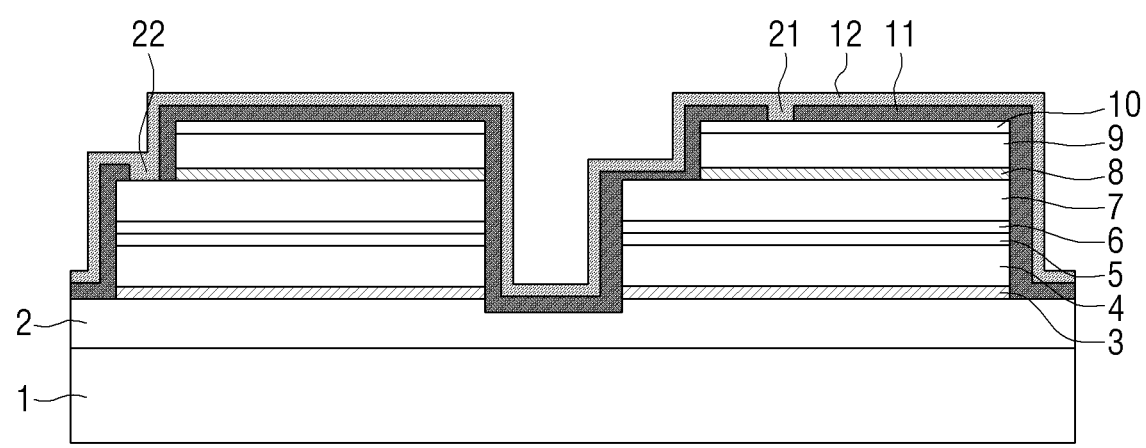
Figure 2E:
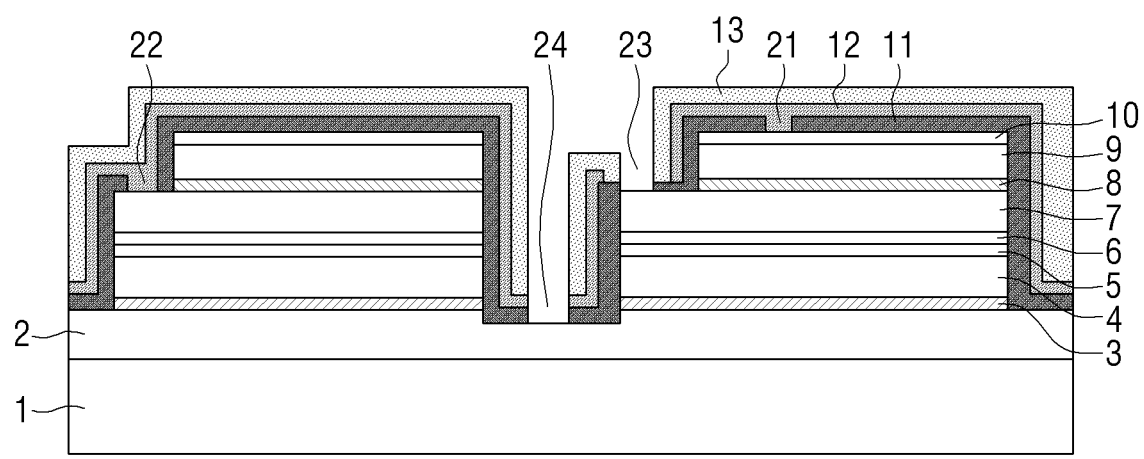

Referring to FIGS. 2C to 2E, a step of forming the light emitting cell may be performed so that an insulating layer 11, a reflective layer 12, and a passivation layer 13 are vapor-deposited on the first light emitting cell and the second light emitting cell.

Figure 2F:
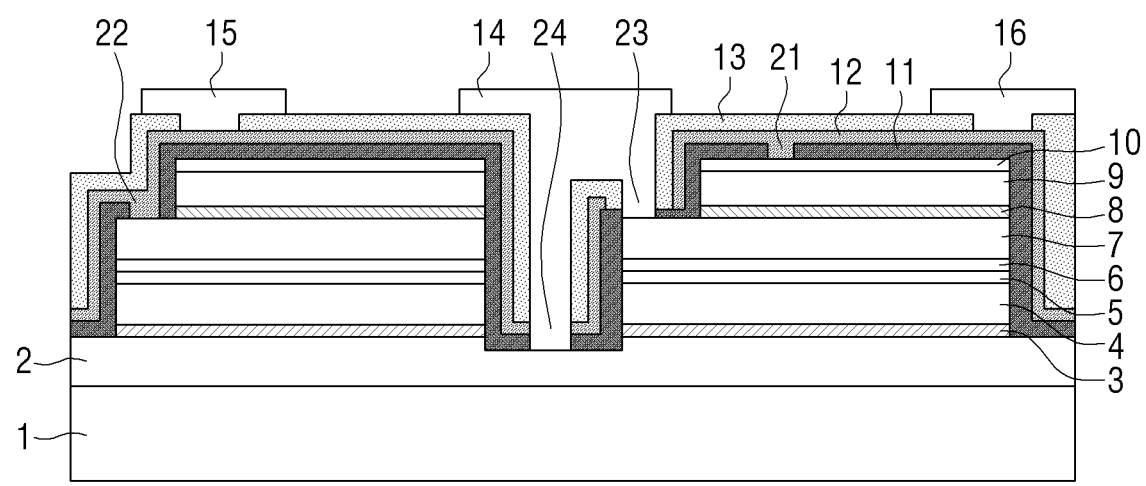

In addition, referring to FIG. 2F, the step of forming the light emitting cells may be performed so that a common electrode 14 is formed between the first light emitting cell and the second light emitting cell.

Meanwhile, in the step of forming the second light emitting cell, a light emitting area of the second light emitting cell may be formed to be different from a light emitting area of the first light emitting cell. An embodiment regarding a display device including a light emitting element having such asymmetric light emitting regions will be described later with reference to FIG. 7.

When the first light emitting cell and the second light emitting cell are formed, referring to FIG. 2C, the insulating layer 11 may be vapor-deposited on the first light emitting cell and the second light emitting cell so that the first light emitting cell and the second light emitting cell are electrically separated from each other (S304).

When the insulating layer 11 is vapor-deposited, referring to FIG. 2D, first contact holes 21 and 22 may be formed in the insulating layer 11 so that a first pixel electrode 15 and a second pixel electrode 16 are electrically connected to the plurality of conductive semiconductor layers (S305).

When the first contact holes 21 and 22 are formed in the insulating layer 11, referring to FIG. 2D, the reflective layer 12 may be vapor-deposited on the insulating layer 11 (S306).

When the reflective layer 12 is vapor-deposited, referring to FIG. 2E, the passivation layer 13 may be vapor-deposited on the reflective layer 12 (S307).

When the passivation layer 13 is vapor-deposited, referring to FIG. 2E, second contact holes 23 and 24 may be formed in the insulating layer 11, the reflective layer 12, and the passivation layer 13 so that the common electrode 14 is electrically connected to the plurality of conductive semiconductor layers (S308).

When the second contact holes 23 and 24 are formed, referring to FIG. 2F, the common electrode 14 electrically connected to the first light emitting cell and the second light emitting cell may be formed in a region separated between the first light emitting cell and the second light emitting cell (S309).

In addition, along with the formation of the common electrode 14, referring to FIG. 2F, the first pixel electrode 15 electrically connected to the first light emitting cell may be formed (S310) and the second pixel electrode 16 electrically connected to the second light emitting cell may be formed (S311).

Meanwhile, hereinabove, the step S302 of forming the first light emitting cell and the step S303 of forming the second light emitting cell have been separately described, but this is merely for clearly describing the structure of the light emitting element according to the disclosure, and the time order of both steps is not particularly limited.

In the same manner, in a case of the step of vapor depositing or forming the plurality of elements equivalent to each other such as the step S310 of forming the first pixel electrode 15 and the step S311 of forming the second pixel electrode 16, no time series element is present between both steps.

Hereinabove, the light emitting element and the method for manufacturing thereof according to various embodiments of the disclosure have been described, and hereinafter, a display device including the light emitting element described above will be described.

Figure 4:
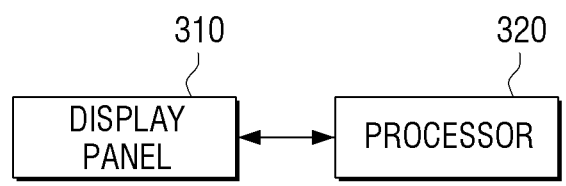
FIG. 4 is a block diagram illustrating a brief configuration of a display device according to an embodiment.

FIG. 4 is a block diagram illustrating a brief configuration of a display device according to an embodiment.

Referring to FIG. 4, a display device 300 according to an embodiment of the disclosure may include a display panel 310 and a processor 320.

The display panel 310 may include a plurality of light emitting elements and a plurality of switching elements.

Specifically, the display panel 310 may include the plurality of light emitting elements 1 according to the various embodiments of the disclosure described above, and accordingly, the light emitting element 1 included in the display panel 310 may be a multi-tunnel junction light emitting element having two or more light emitting regions, which are horizontally separated from each other.

In particular, in the various embodiments of the disclosure, the display panel 310 may include the light emitting element 1 described above, thereby efficiently implementing red, green, and blue pixels through the plurality of light emitting regions included in the single light emitting element. Specific examples of pixel arrangement and specific embodiment thereof will be described later with reference to FIGS. 5 and 7.

Figure 5:
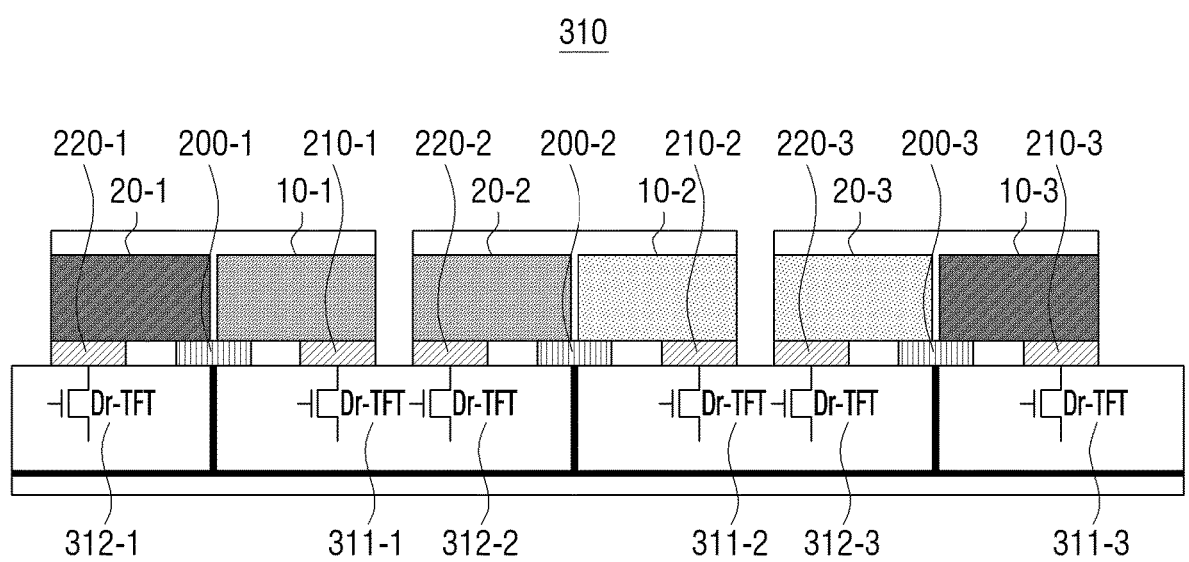
FIG. 5 is a cross-sectional view illustrating a part of a display panel according to an embodiment.
Figure 7:
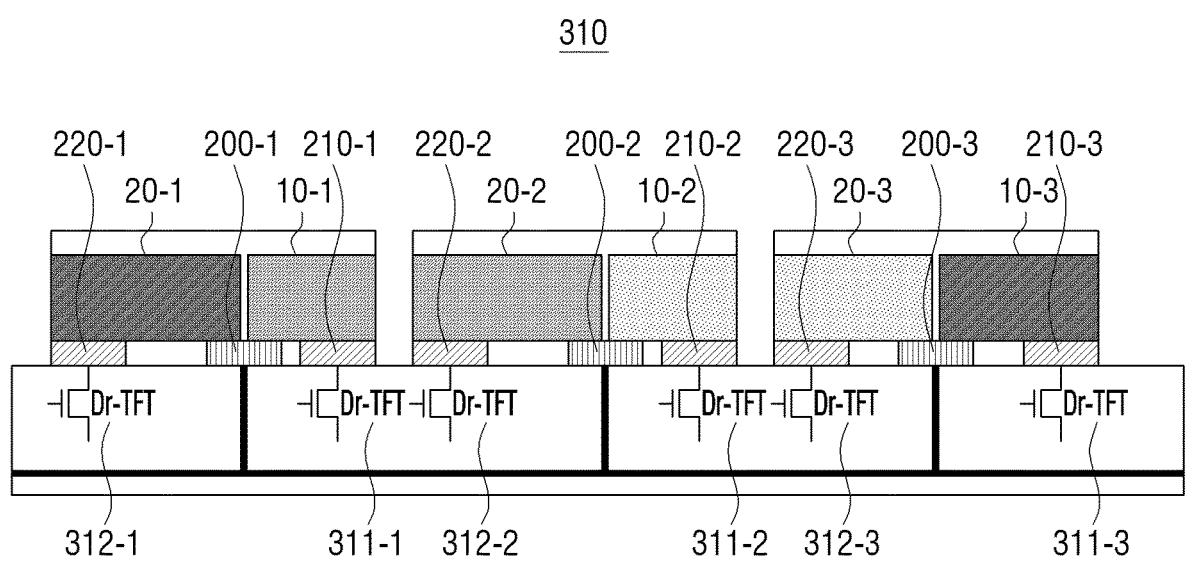
FIG. 7 is a cross-sectional view illustrating a part of another display panel according to an embodiment.

The switching element (not illustrated) may be a semiconductor element configured to control the driving of the light emitting element 1 included in the display panel 310 and may play a role of a kind of a switch for individual pixel of the display device 300. For such a switching element, a driving thin film transistor (TFT) as illustrated in FIGS. 5 and 7 may be used.

In particular, the switching element according to an embodiment of the disclosure may be individually connected to the first light emitting cell and the second light emitting cell via the first pixel electrode and the second pixel electrode, respectively.

The processor 320 may control general operations of the display device 300. The processor 320 may be implemented in various methods. For example, the processor 320 may be implemented as at least one of an application specific integrated circuit (ASIC), an embedded processor, a microprocessor, a hardware control logic, a hardware finite state machine (FSM), and a digital signal processor (DSP).

In addition, the processor 320 may include a ROM, a RAM, a graphic processing unit (GPU), a CPU, and a bus, and the ROM, the RAM, the graphic processing unit (GPU), and the CPU may be connected to each other via the bus.

In particular, in various embodiments of the disclosure, the processor 320 may independently control the driving of the plurality of light emitting cells included in the single light emitting element 1.

As described above, the light emitting element 1 according to the disclosure may include the first light emitting cell, the second light emitting cell, the first pixel electrode electrically connected to the first light emitting cell, and the second pixel electrode electrically connected to the second light emitting cell.

The display panel 310 included in the display device according to the disclosure may include a first switching element electrically connected to the first pixel electrode and a second switching element electrically connected to the second pixel electrode.

Accordingly, the processor 320 may independently control the driving of the first light emitting cell and the second light emitting cell through the first switching element and the second switching element.

The specific embodiment regarding the pixel arrangement of the display panel 310 and the control of the processor 320 will be described later with reference to FIGS. 5 to 7.

FIG. 5 is a cross-sectional view illustrating a part of a display panel according to an embodiment.

Referring to FIG. 5, the display panel according to an embodiment of the disclosure may include a plurality of light emitting elements and a plurality of switching elements.

The light emitting elements may include first light emitting cells 10-1, 10-2, and 10-3 and second light emitting cells 20-1, 20-2, and 20-3 and may include common electrodes 200-1, 200-2, and 200-3 electrically connected to both the first light emitting cells 10-1, 10-2, and 10-3 and the second light emitting cells 20-1, 20-2, and 20-3, first pixel electrodes 210-1, 210-2, and 210-3 individually connected to the first light emitting cells 10-1, 10-2, and 10-3, and second pixel electrodes 220-1, 220-2, and 220-3 individually connected to the second light emitting cells 20-1, 20-2, and 20-3, respectively.

In addition, first switching elements 311-1, 311-2, and 311-3 may be individually connected to the first pixel electrodes 210-1, 210-2, and 210-3, respectively, and second switching elements 312-1, 312-2, and 312-3 may be individually connected to the second pixel electrodes 220-1, 220-2, and 220-3, respectively.

Meanwhile, in a case of implementing the display panel as illustrated in FIG. 5, the light emitting region of the second light emitting cell may be defined as a necessary light emitting region and the light emitting region of the first light emitting cell may be defined as an extra light emitting region.

Accordingly, the display panel may be implemented so that the pixel driving of the general display device are performed by the second light emitting cells 20-1, 20-2, and 20-3, and if high luminance, high purity, or high resolution is required according to display product specification, the first light emitting cells 10-1, 10-2, and 10-3 are used.

Meanwhile, a defective pixel generated in the light emitting element may be repaired by using the extra light emitting region defined as described above, and this will be described with reference to FIG. 6.

FIGS. 6A to 6D are schematic views illustrating an embodiment regarding a case where a defective pixel is generated in the light emitting element according to an embodiment.

Specifically, FIGS. 6A to 6D illustrate light emitting regions 10-1, 10-2, and 10-3 of the first light emitting cells and light emitting regions 20-1, 20-2, and 20-3 of the second light emitting cells included in the light emitting elements, respectively. As described above, the light emitting regions 20-1, 20-2, and 20-3 of the second light emitting cells may be defined as necessary light emitting regions and the light emitting regions 10-1, 10-2, and 10-3 of the first light emitting cells may be defined as extra light emitting regions.

Figure 6A:
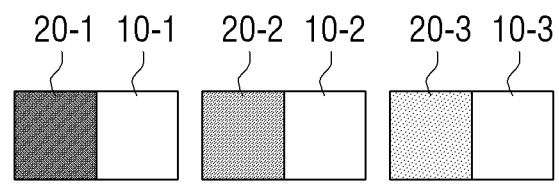
FIGS. 6A to 6D are schematic views illustrating an embodiment regarding a case where a defective pixel is generated in the light emitting element according to an embodiment.
Figure 6B:
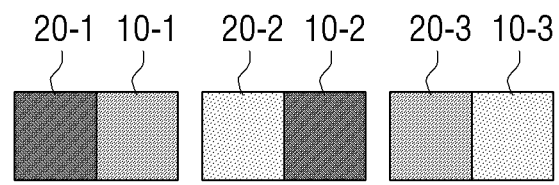

When the light emitting elements according to an embodiment of the disclosure is normally driven, all of the light emitting cells corresponding to the necessary light emitting regions 20-1, 20-2, and 20-3 of the respective light emitting elements are normally driven as illustrated in FIG. 6A, or all of the light emitting cells corresponding to the necessary light emitting regions 20-1, 20-2, and 20-3 and the extra light emitting regions 10-1, 10-2, and 10-3 may be normally driven as illustrated in FIG. 6B.

Figure 6C:
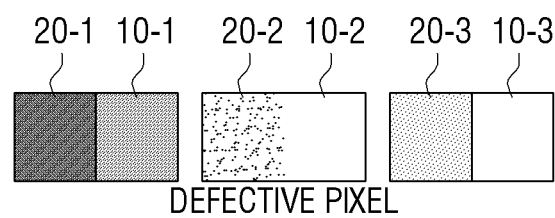
Figure 6D:
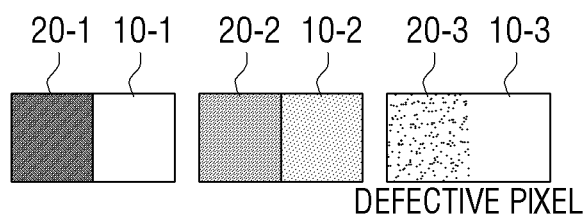

However, referring to FIGS. 6C and 6D, a defective pixel may be generated in at least one of the light emitting regions 10-1, 10-2, and 10-3 of the first light emitting cells and the light emitting regions 20-1, 20-2, and 20-3 of the second light emitting cells.

However, as described above, the processor 320 according to the disclosure may independently control the driving of the first light emitting cell and the second light emitting cell included in the light emitting element, thereby repairing the defective pixel generated as in the case of FIGS. 6C and 6D.

In other words, the processor 320 may perform a control to replace the defective pixel using at least one of the first light emitting cell and the second light emitting cell included in the light emitting element adjacent to the region where the defective pixel is generated.

For example, the processor 320 may replace the defective pixel using the light emitting region 10-1 included in the light emitting element adjacent to the region 20-2 where the defective pixel is generated as illustrated in FIG. 6C. In addition, the processor 320 may replace the defective pixel using the light emitting region 10-2 included in the light emitting element adjacent to the region 20-3 where the defective pixel is generated as illustrated in FIG. 6D.

According to an embodiment of the disclosure described above, it is possible to resolve a problem regarding repairing process cost of the defective pixel by efficiently repairing the generated defective pixel.

FIG. 7 is a cross-sectional view illustrating a part of another display panel according to an embodiment.

Referring to FIG. 7, the display panel according to an embodiment of the disclosure may include the plurality of light emitting elements and the plurality of switching elements.

The light emitting elements may include the first light emitting cells 10-1, 10-2, and 10-3 and the second light emitting cells 20-1, 20-2, and 20-3 and may include the common electrodes 200-1, 200-2, and 200-3 electrically connected to both the first light emitting cells 10-1, 10-2, and 10-3 and the second light emitting cells 20-1, 20-2, and 20-3, the first pixel electrodes 210-1, 210-2, and 210-3 individually connected to the first light emitting cells 10-1, 10-2, and 10-3, and the second pixel electrodes 220-1, 220-2, and 220-3 individually connected to the second light emitting cells 20-1, 20-2, and 20-3, respectively.

In addition, the first switching elements 311-1, 311-2, and 311-3 may be individually connected to the first pixel electrodes 210-1, 210-2, and 210-3, respectively, and the second switching elements 312-1, 312-2, and 312-3 may be individually connected to the second pixel electrodes 220-1, 220-2, and 220-3, respectively.

Meanwhile, light emitting efficiency of the light emitting element, particularly, external quantum efficiency (EQE) may significantly vary depending on color. For example, in a case of a GaN-based LED, a red element shows EQE of less than 10%, a green element shows EQE of less than 30%, and a blue element shows EQE of less than 80%.

In other words, the red element and the green element show greatly lower light emitting efficiency than the light emitting efficiency of the blue element, and accordingly, it is necessary to use high power or increase the light emitting area, in order to satisfy luminance necessary for implementing such colors with low light emitting efficiency.

According to the light emitting element with the multi-tunnel junction structure of the related art, there was a limit in increasing the light emitting area structurally, and it was necessary to ensure an increase in power consumption.

However, since the display panel according to an embodiment of the disclosure includes the multi-tunnel junction light emitting element having two or more light emitting regions, which are horizontally separated from each other, the problem described above may be overcome by forming a larger light emitting area of the light emitting cell for implementing colors with low light emitting efficiency.

In other words, according to an embodiment of the disclosure, the display panel may be implemented to include light emitting element in which the light emitting area of the first light emitting cell is different from the light emitting area of the second light emitting cell.

Specifically, referring to FIG. 7, the display panel may be implemented so that the light emitting region 20-1 of the light emitting cell for implementing red color and the light emitting region 20-2 of the light emitting cell for implementing green color have a larger light emitting area than the light emitting region 20-3 of the light emitting cell for implementing blue color.

As described above, by forming the light emitting area of the first light emitting cell and the light emitting area of the second light emitting cell included in the same light emitting element asymmetrically, it is possible to enlarge the light emitting area of the light emitting cell for implementing a color desired to emphasize, and accordingly, it is possible to improve color reproducibility of the display device.

As described above, by forming a larger light emitting area of the light emitting cell for implementing the color with low light emitting efficiency, it is possible to resolve the problem regarding the power consumption due to a difference in light emitting efficiency for each pixel color when manufacturing the display device.

Hereinabove, the preferred embodiments of the disclosure has been illustrated and descried. The disclosure is not limited to the aforementioned specific embodiments, and it is apparent that various modifications can be made by those having ordinary skill in the technical field to which the disclosure belongs, without departing from the gist of the disclosure as claimed by the appended claims. Also, it is intended that such modifications are not to be interpreted independently from the technical idea or prospect of the disclosure.

What is claimed is:

1. A light emitting element comprising:
    a first light emitting cell comprising a first light emitting layer and a plurality of conductive semiconductor layers laminated on upper and lower portions of the first light emitting layer, wherein the plurality of conductive semiconductor layers comprise a p+-GaN and a n+-GaN layer sequentially laminated on an upper portion of the first light emitting layer;
    a second light emitting cell comprising a second light emitting layer configured to emit light different from the first light emitting layer, and a plurality of conductive semiconductor layers laminated on upper and lower portions of the second light emitting layer;
    an insulating layer provided on the first light emitting cell and the second light emitting cell so that the first light emitting cell and the second light emitting cell are electrically separated from each other;
    a reflective layer provided on at least a portion of the insulating layer;
    a passivation layer provided on at least a portion of the reflective layer;
    a common electrode configured to be electrically connected to the first light emitting cell and the second light emitting cell;
    a first pixel electrode configured to be electrically connected to the first light emitting cell; and
    a second pixel electrode configured to be electrically connected to the second light emitting cell,
    wherein a light emitting region of the first light emitting cell and a light emitting region of the second light emitting cell are horizontally separated from each other by the common electrode.

2. The light emitting element according to claim 1, wherein the plurality of conductive semiconductor layers comprises a first n-GaN layer laminated on a lower portion of the first light emitting layer, a first p-GaN layer laminated on an upper portion of the first light emitting layer, a second n-GaN layer laminated on a lower portion of the second light emitting layer, and a second p-GaN layer laminated on an upper portion of the second light emitting layer, and wherein the p+-GaN and the n+-GaN layer are sequentially laminated on an upper portion of the first p-GaN layer.

3. The light emitting element according to claim 1, further comprising:
    a first contact hole formed in the insulating layer; and
    a second contact hole formed in the insulating layer, the reflective layer, and the passivation layer,
    wherein the first pixel electrode and the second pixel electrode are electrically connected to the plurality of conductive semiconductor layers via the reflective layer and the first contact hole, and
    wherein the common electrode is electrically connected to the plurality of conductive semiconductor layers via the second contact hole.

4. The light emitting element according to claim 1, wherein a light emitting area of the first light emitting cell is different from a light emitting area of the second light emitting cell.

5. The light emitting element according to claim 1, wherein the first light emitting layer and the second light emitting layer have a multi-quantum well structure.

6. The light emitting element according to claim 1, further comprising:
    a third light emitting cell comprising a third light emitting layer and a plurality of conductive semiconductor layers laminated on upper and lower portions of the third light emitting layer; and
    a third pixel electrode configured to be electrically connected to the third light emitting cell,
    wherein light emitted by the third light emitting layer is different from at least one of light emitted by the first light emitting layer and light emitted by the second light emitting layer, wherein the common electrode is configured to be electrically connected to the first light emitting cell, the second light emitting cell, and the third light emitting cell, and wherein the light emitting region of the first light emitting cell, the light emitting region of the second light emitting cell, and a light emitting region of the third light emitting cell are horizontally separated from each other by the common electrode.

7. A display device comprising:
a display panel comprising a light emitting element and a switching element; and
a processor configured to control the display panel,
wherein the light emitting element comprises:
a first light emitting cell comprising a first light emitting layer and a plurality of conductive semiconductor layers laminated on upper and lower portions of the first light emitting layer, wherein the plurality of conductive semiconductor layers comprise a p+-GaN and a n+-GaN GaN layer sequentially laminated on an upper portion of the first light emitting layer;
a second light emitting cell comprising a second light emitting layer configured to emit light different from the first light emitting layer, and a plurality of conductive semiconductor layers laminated on upper and lower portions of the second light emitting layer;
an insulating layer provided on the first light emitting cell and the second light emitting cell so that the first light emitting cell and the second light emitting cell are electrically separated from each other;
a reflective layer provided on at least a portion of the insulating layer;
a passivation layer provided on at least a portion of the reflective layer;
a common electrode configured to be electrically connected to the first light emitting cell and the second light emitting cell;
a first pixel electrode configured to be electrically connected to the first light emitting cell; and
a second pixel electrode configured to be electrically connected to the second light emitting cell,
wherein a light emitting region of the first light emitting cell and a light emitting region of the second light emitting cell are horizontally separated from each other by the common electrode.

8. The display device according to claim 7, wherein the display panel comprises a first switching element electrically connected to the first pixel electrode and a second switching element electrically connected to the second pixel electrode, and
wherein the processor is configured to independently control driving of the first light emitting cell and the second light emitting cell via the first switching element and the second switching element.

9. The display device according to claim 7, wherein the processor is configured to, based on a defective pixel being generated in at least one of the first light emitting cell and the second light emitting cell, control the driving of at least one of a first light emitting cell and a second light emitting cell included in a light emitting element adjacent to a light emitting element where the defective pixel is generated, to replace the defective pixel.

10. The display device according to claim 7, wherein a light emitting area of the first light emitting cell is different from a light emitting area of the second light emitting cell.

11. The display device of claim 7, wherein the plurality of conductive semiconductor layers comprises a first n-GaN layer laminated on a lower portion of the first light emitting layer, a first p-GaN layer laminated on an upper portion of the first light emitting layer, a second n-GaN layer laminated on a lower portion of the second light emitting layer, and a second p-GaN layer laminated on an upper portion of the second light emitting layer, and wherein the p+-GaN and the n+-GaN layer are sequentially laminated on an upper portion of the first p-GaN layer.

12. A method for manufacturing a light emitting element, the method comprising:
vapor-depositing a first light emitting layer, a second light emitting layer configured to emit light different from the first light emitting layer, and a plurality of conductive semiconductor layers laminated on upper and lower portions of the first light emitting layer on a substrate;
forming a first light emitting cell including the first light emitting layer and the plurality of conductive semiconductor layers, wherein the plurality of conductive semiconductor layers comprise a p+-GaN and a n+-GaN layer sequentially laminated on an upper portion of the first light emitting layer;
forming a second light emitting cell including the second light emitting layer and the plurality of conductive semiconductor layers and horizontally separated from the first light emitting cell;
vapor-depositing an insulating layer on the first light emitting cell and the second light emitting cell so that the first light emitting cell is electrically separated from the second light emitting cell;
vapor depositing a reflective layer provided on at least a portion of the insulating layer;
vapor depositing a passivation layer provided on at least a portion of the reflective layer;
forming a common electrode electrically connected to the first light emitting cell and the second light emitting cell in a region separated between the first light emitting cell and the second light emitting cell;
forming a first pixel electrode electrically connected to the first light emitting cell; and
forming a second pixel electrode electrically connected to the second light emitting cell.

13. The method according to claim 12, wherein the vapor-depositing the first light emitting layer, the second light emitting layer, and the plurality of conductive semiconductor layers comprises:
vapor-depositing a first n-GaN layer on the substrate;
vapor-depositing the first light emitting layer on an upper portion of the first n-GaN layer;
vapor-depositing a first p-GaN layer on an upper portion of the first light emitting layer, and wherein the p+-GaN and the n+-GaN layer are sequentially vapor-deposited on an upper portion of the first p-GaN layer;
vapor-depositing a second n-GaN layer on an upper portion of the $n^+$-GaN layer;
vapor-depositing the second light emitting layer on an upper portion of the second n-GaN layer; and
vapor-depositing a second p-GaN layer on an upper portion of the second light emitting layer.

14. The method according to claim 12, further comprising:
forming a first contact hole in the insulating layer;
forming a second contact hole in the insulating layer, the reflective layer, and the passivation layer,
wherein the forming the first contact hole comprises forming the first contact hole so that the first pixel electrode and the second pixel electrode are electrically connected to the plurality of conductive semiconductor layers via the reflective layer, and wherein the forming the second contact hole comprises forming the second contact hole so that the common electrode is electrically connected to the plurality of conductive semiconductor layers.

15. The method according to claim 12, wherein the forming the second light emitting cell comprises forming the second light emitting cell so that a light emitting area of the second light emitting cell is different from a light emitting area of the first light emitting cell.

* * * * *